United States Patent
Lin et al.

(10) Patent No.: US 9,874,807 B2
(45) Date of Patent: Jan. 23, 2018

(54) OPTICAL IMAGE CAPTURING MODULE, ALIGNMENT METHOD, AND OBSERVATION METHOD

(71) Applicant: METAL INDUSTRIES RESEARCH&DEVELOPMENT CENTRE, Kaohsiung (TW)

(72) Inventors: Shi-Wei Lin, Kaohsiung (TW); Chun-Ming Yang, Kaohsiung (TW); Chih-Chin Wen, Hsinchu (TW); Chorng-Tyan Lin, Kaohsiung (TW)

(73) Assignee: METAL INDUSTRIES RESEARCH&DEVELOPMENT CENTRE, Kaohsiung (TW)

( * ) Notice: Subject to any disclaimer, the term of this patent is extended or adjusted under 35 U.S.C. 154(b) by 365 days.

(21) Appl. No.: 14/094,965

(22) Filed: Dec. 3, 2013

(65) Prior Publication Data
US 2014/0184791 A1 Jul. 3, 2014

(30) Foreign Application Priority Data
Dec. 27, 2012 (TW) .............................. 101150499 A (51) Int. Cl.
*G02B 27/14* (2006.01)
*G01B 11/00* (2006.01)
(Continued)

(52) U.S. Cl.
CPC ............. *G03B 41/00* (2013.01); *G03B 15/03* (2013.01); *G03B 17/17* (2013.01); *G03B 33/00* (2013.01);
(Continued)

(58) Field of Classification Search
CPC .... G03F 9/7038; G03F 9/7046; G03F 9/7088; G03F 9/7069; G03F 9/7065;
(Continued)

(56) References Cited

U.S. PATENT DOCUMENTS

| | | |
|---|---|---|
| 3,684,384 A | 8/1972 | Hojo et al. |
| 4,574,197 A | 3/1986 | Kliever |

(Continued)

OTHER PUBLICATIONS

"Filtration Techniques for Surface Texture" by by François Blateyron at www.digitalsurf.fr, (c) 1996.*

*Primary Examiner* — Dramos I Kalapodas
(74) *Attorney, Agent, or Firm* — WPAT, PC (57) ABSTRACT

An optical image capturing module and an alignment method and an observation method for an upper substrate and a lower substrate using the optical image capturing module are provided. The upper substrate and the lower substrate are disposed opposite. The alignment method includes the following steps of: emitting a light ray; filtering the light ray and dividing the light ray into a light ray at first wavelength and a light ray at second wavelength, whereby the light ray at first wavelength irradiates a pattern on the upper substrate, and the light ray at second wavelength irradiates a pattern on the lower substrate; reflecting the pattern on the upper substrate to an image capturing device; reflecting the pattern on the lower substrate to the image capturing device; and determining the positions of the pattern on the upper substrate and the pattern on the lower substrate on the image capturing device.

7 Claims, 9 Drawing Sheets

(51) Int. Cl.
*G03B 41/00* (2006.01)
*G03B 15/03* (2006.01)
*G03B 17/17* (2006.01)
*G03B 33/00* (2006.01)
*G03F 9/00* (2006.01)

(52) U.S. Cl.
CPC .......... *G03F 9/7038* (2013.01); *G03F 9/7046* (2013.01); *G03F 9/7088* (2013.01); *G03B 2215/0582* (2013.01)

(58) Field of Classification Search
CPC ... G03F 7/70258; G03F 9/7049; G03B 17/17; G03B 41/00; G03B 15/03; G03B 2215/0582; G03B 33/00; G03B 21/26; G03B 5/04; G03B 5/30; G03B 33/12; G03B 21/14; G01B 11/272; G02F 1/03; G02F 1/1335; G02F 1/1396; G02F 2203/02; G02F 2001/1398; F21V 9/00; G02B 27/14; G02B 27/12; G02B 2207/123; G02B 5/204; G02B 13/007; G02B 13/0065; G02B 27/10; G02B 27/1033; G02B 17/0694; G02B 27/1073; G02B 27/149; G02B 27/28; G02B 27/1013; G02B 5/04; G02B 11/27; H04N 7/18; H04N 9/317; H04N 9/3105
See application file for complete search history.

(56) References Cited

U.S. PATENT DOCUMENTS

| | | | | |
|---|---|---|---|---|
| 5,457,538 A * | 10/1995 | Ujiie | ................ | H05K 13/0413 348/87 |
| 5,481,362 A * | 1/1996 | Van Den Brink | .... | G03F 9/7049 356/401 |
| 5,519,535 A * | 5/1996 | Mok | ................ | B23K 1/0016 356/399 |
| 5,621,813 A * | 4/1997 | Brown | ................ | G03F 7/70 348/95 |
| 5,850,279 A * | 12/1998 | Nara | ................ | G03F 7/70275 355/53 |
| 5,923,403 A * | 7/1999 | Jain | ................ | G03F 7/70216 355/26 |
| 5,943,089 A * | 8/1999 | Douglas | ................ | B41F 33/0081 348/129 |
| 6,097,544 A * | 8/2000 | Edlinger | ................ | G02B 5/04 359/629 |
| 6,219,130 B1 * | 4/2001 | Kawakubo | ........... | G03F 9/7088 250/492.2 |
| 6,538,740 B1 * | 3/2003 | Shiraishi | ........... | G03F 7/70591 250/548 |
| 6,636,276 B1 * | 10/2003 | Rosenbluth | .......... | H04N 9/3117 348/E9.027 |
| 6,781,775 B2 * | 8/2004 | Bendat | ................ | G02B 5/04 356/399 |
| 6,937,344 B2 * | 8/2005 | Monshouwer | ...... | G03F 7/70633 356/399 |
| 7,142,284 B2 * | 11/2006 | Mishima | ............... | G03F 9/7011 355/53 |
| 7,192,141 B2 * | 3/2007 | Van Den Bossche | . | H04N 9/317 348/757 |
| 7,193,686 B2 * | 3/2007 | Lee, II | ................ | G03F 9/7011 355/53 |
| 7,887,192 B2 * | 2/2011 | Chen | ................ | G02B 27/102 353/33 |
| 7,990,600 B2 * | 8/2011 | Sachs | ................ | G02B 27/1026 359/241 |
| 2002/0140905 A1 * | 10/2002 | Ouchi | ................ | G02B 27/1026 353/31 |
| 2003/0122972 A1 * | 7/2003 | Nelson | ................ | H04N 9/3105 348/745 |
| 2003/0123031 A1 * | 7/2003 | Nelson | ................ | H04N 9/3105 353/31 |
| 2006/0007539 A1 * | 1/2006 | Mihalakis | ........... | G02B 27/283 359/489.11 |
| 2007/0115552 A1 * | 5/2007 | Robinson | ........... | G02B 27/1026 359/487.04 |
| 2011/0128734 A1 * | 6/2011 | Sumiyama | ........... | G02B 5/284 362/235 |
| 2011/0292362 A1 * | 12/2011 | Enomoto | ............ | G03F 9/7088 355/52 |

* cited by examiner

FIG. 4

OPTICAL IMAGE CAPTURING MODULE, ALIGNMENT METHOD, AND OBSERVATION METHOD

CROSS-REFERENCE TO RELATED APPLICATION

This application claims the benefit of Taiwan Patent Application No. 101150499, filed on Dec. 27, 2012, which is hereby incorporated by reference for all purposes as if fully set forth herein.

BACKGROUND OF THE INVENTION

Field of Invention

The present invention relates to an optical image capturing module, and more particularly to an optical image capturing module formed by four prisms, two wavelength-selective films to filter the specific light ray with different wavelengths, an alignment method for an upper substrate and a lower substrate, and an observation method for an upper substrate and a lower substrate using the optical image capturing module of the present invention.

Related Art

U.S. Pat. No. 3,684,384 discloses a compound optical prism module, which is formed with a truncated quadrangular, right prism with a 45° truncation and a rectangular prism united to the optical prism module to form a parallelepiped with a half-silvered mirror film at their interface and with a total reflecting mirror film at the vertical surface of the rectangular prism, so that the two components are opposed in their mated positions can be superposed in the same coordinate space for image observation. However, this prior art patent discloses the use of two right-angle prisms with different sizes, resulting in different lengths for an upper light path length and a lower light path length, limited manners of mounting light sources, and also a large module volume.

U.S. Pat. No. 5,519,535 also discloses a compound optical prism module, which is formed with two same size right-angle prisms and similar to U.S. Pat. No. 3,684,384. More particularly, a liquid crystal shutter is mounted onto one face of each right-angle prisms control image showing for objects at different sides, respectively. However, the liquid crystal shutter disclosed in this prior art patent sacrifices light intensity efficiency to some degree, and a number of control components are required.

U.S. Pat. No. 4,574,197 discloses a dual field of view sensing device, in which mainly a polygonal prism is used, and through mechanism rotation control, a light ray is refracted and then two parallel light paths are reflected into a single detector to obtain symmetrical light paths; switching of the light paths depends on the rotational position of the prism, and two different light beams are reflected into a single image space through the prism. However, the device volume disclosed in this prior art patent is too large, the light path is designed too long, and the mechanical control is too complicated.

In the prior art, to map two different images (or light beams) in a single image plane, different prism forms are mainly adopted, and the aforementioned prior art patents (U.S. Pat. No. 3,684,384 and U.S. Pat. No. 5,519,535) are the most common, in which a compound prism is used to reflect light paths from opposite image positions into a single image space. However, the problem that the reflection path lengths of the opposite light rays are not equal occurs in both patents. By taking image capturing into consideration, the working distance become unequal, causing that the opposite side objects must be placed at asymmetrical distances, which makes the fabrication process complicated. Also, currently a compound prism module has a number of refraction paths and a large volume, and no longer satisfied the current fabrication processes in the optoelectronics industry.

Therefore, an optical image capturing module having symmetrical light paths needs to be provided to solve the foregoing problem.

SUMMARY OF THE INVENTION

The purpose of the present invention is to provide an optical image capturing module having symmetrical light path lengths and helpfully reducing a component volume of an image module, an alignment method, and an observation method for an upper substrate and a lower substrate applying the optical image capturing module.

To achieve the above objectives, the present invention provides an optical image capturing module including: an image capturing device; a first prism, having a first face, a second face, and a third face, wherein the first face and the second face of the first prism have an equal sectional length; a second prism, having a first face and a second face, wherein the first face and the second face of the second prism have an equal sectional length, and the second face of the second prism is adjacent to the first face of the first prism; a third prism, having a first face and a second face, wherein the first face and the second face of the third prism have an equal sectional length, and the first face of the third prism is adjacent to the second face of the first prism; a fourth prism, having a first face and a second face, wherein the first face and the second face of the fourth prism have an equal sectional length, the first face of the third prism is adjacent to the second face of the third prism, and the second face of the fourth prism is adjacent to the first face of the second prism; a beam splitter, disposed between the first prism and the image capturing device, and located at a side of the third face of the first prism; a light source, used to emit a light ray, wherein the light ray enters the beam splitter, and a direction that the light ray enters the beam splitter is perpendicular to an image receiving direction of the image capturing device; a first wavelength-selective film with a selective wavelength higher than a cut-off wavelength, wherein a part of the first wavelength-selective film is located between the first face of the first prism and the second face of the second prism, and another part of the first wavelength-selective film is located between the second face of the third prism and the first face of the fourth prism, the first wavelength-selective film allows a first wavelength light ray at the wavelengths higher than a cut-off wavelength to pass through, and reflects a second wavelength light ray at the wavelengths lower than the cut-off wavelength; and a second wavelength-selective film with a selective wavelength lower than the cut-off wavelength, wherein a part of the second wavelength-selective film is located between the second face of the first prism and the first face of the third prism, and another part of the second wavelength-selective film is located between the first face of the second prism and the second face of the fourth prism, the second wavelength-selective film allows the second wavelength light ray at the wavelengths lower than the cut-off wavelength to pass through and reflects the first wavelength light ray at the wavelengths higher than the cut-off wavelength.

The present invention further provides an alignment method for an upper substrate and a lower substrate, the upper substrate and the lower substrate being disposed opposite, and the alignment method including the following steps of: emitting a light ray; filtering the light ray to divide the light ray into a first wavelength light ray and a second wavelength light ray, whereby the first wavelength light ray irradiates a pattern on the upper substrate, and the second wavelength light ray irradiates a pattern on the lower substrate; reflecting the pattern on the upper substrate to an image capturing device; reflecting the pattern on the lower substrate to the image capturing device; and determining the positions of the pattern on the upper substrate and the pattern on the lower substrate on the image capturing device.

The present invention further provides an observation method, used to observe a pattern on an upper substrate or a lower substrate, the upper substrate and the lower substrate being disposed opposite, and the observation method including the following steps of: emitting a first wavelength light ray, and irradiating the upper substrate; reflecting the pattern on the upper substrate to an image capturing device; observing the pattern on the upper substrate; turning off the first wavelength light ray; emitting a second wavelength light ray, and irradiating the lower substrate; reflecting the pattern on the lower substrate to the image capturing device; and observing the pattern on the lower substrate.

The present invention can provide symmetrical light path lengths, helpfully reduce the volume of an image module component, and can achieve symmetrically working distances, and symmetry is achieved for the images at the two sides. Compared with that a compound right-angle prism causes unequal reflection path lengths for the light rays from the upper object and the lower object in the prior art, considering in terms of image capturing, the present invention does not cause unequal working distances, and therefore the upper object and the lower object (an upper substrate and a lower substrate) in the present invention are not required to be placed at asymmetrical distances.

To make the aforementioned and other objects, features and advantages of the present invention clearer, detailed illustration is provided in the following with reference to the accompanying drawings.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Figure 1A:
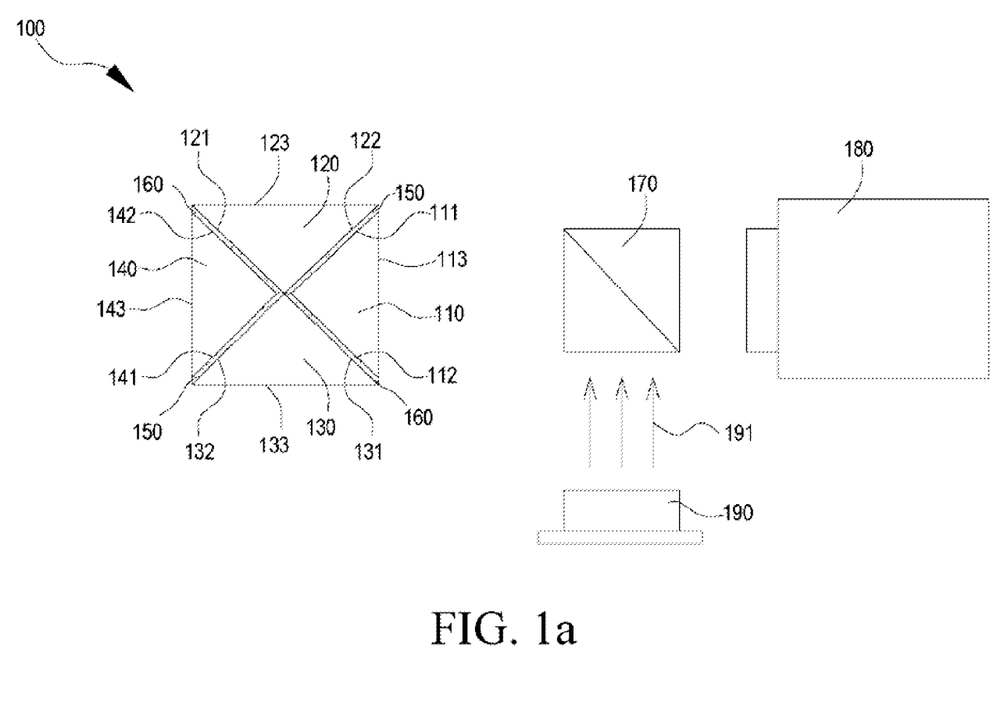
FIG. 1a is a schematic structural view of an optical image capturing module according to an embodiment of the present invention.

Please refer to FIG. 1a. FIG. 1a is a schematic structural view of an optical image capturing module according to an embodiment of the present invention. An optical image capturing module 100 includes: an image capturing device 180, a first prism 110, a second prism 120, a third prism 130, a fourth prism 140, a first wavelength-selective film 150, a second wavelength-selective film 160, a beam splitter 170, and a light source 190. The first prism 110, the second prism 120, the third prism 130, and the fourth prism 140 all have a first face, a second face and a third face, and the first face and the second face have an equal sectional length, for example, a first face 111 and a second face 112 of the first prism 110 have an equal sectional length.

Figure 1B:
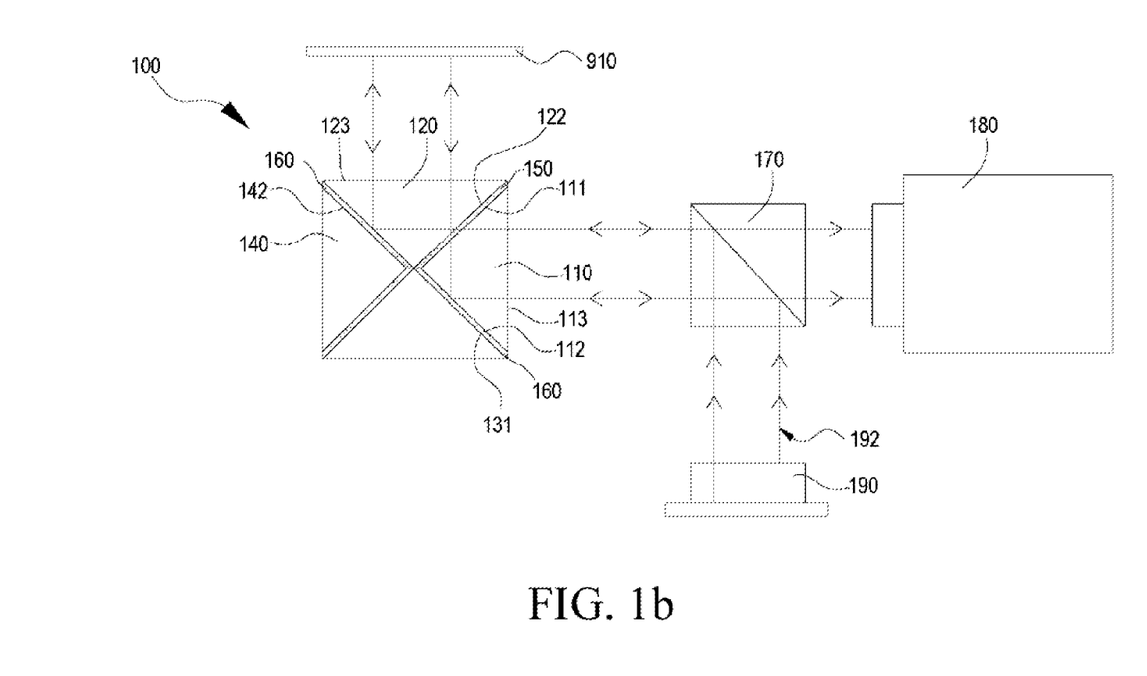
FIG. 1b is a schematic structural view of an optical image capturing module according to an embodiment of the present invention showing a light path of a first wavelength light ray at the wavelength higher than the cut-off wavelength.

A part of the first-selective film 150 is formed on the first face 111 of the first prism 110 or a second face 122 of the second prism 120, and another part of the first wavelength-selective film 150 is formed on a second face 132 of the third prism 130 or a first face 141 of the fourth prism 140. A part of the second wavelength-selective film 160 is formed on the second face 112 of the first prism 110 or a first face 131 of the third prism 130, and another part of the second wavelength-selective film 160 is formed on a first face 121 of the second prism 120 or a second face 142 of the fourth prism 140. In this embodiment, a part of the first wavelength-selective film 150 is formed on the first face 111 of the first prism 110, another part of the first wavelength-selective film 150 is formed on the first face 141 of the fourth prism 140, a part of the second wavelength-selective film 160 is formed on the second face 112 of the first prism 110, and another part of the second wavelength-selective film 160 is formed on the second face 142 of the fourth prism 140. The first wavelength-selective film 150 and the second wavelength-selective film 160 are transmissive for a light ray at specific wavelengths and reflect light rays of other wavelengths, and the specific wavelengths may be a single wavelength or wavelengths in a range. Please refer to FIG. 1d at the same time. FIG. 1d is a spectral diagram for showing different light wavelengths of a first wavelength-selective film and a second wavelength-selective film. In FIG. 1d, the horizontal axis represents wavelengths, the vertical axis represents that the first and second-selective films have different transmittances for describing transmissive capacity and light intensity with wavelengths, the curve 150a represents a transmittance curve of the first wavelength-selective film 150, the curve 160a represents a transmittance curve of the second wavelength-selective film 160, the intersection between the curve 150a and the curve 160a is a cut-off wavelength as the position shown by the dotted line 194 in FIG. 1d. In this embodiment, the designed cut-off wavelength is 550 (nm), so that the first wavelength-selective film 150 allows the light ray at the wavelength [for example, 635 (nm)] higher than the cut-off wavelength to pass through and reflects the light ray at the first wavelength [for example, 445 (nm)] lower than the cut-off wavelength. The second wavelength-selective film 160 allows the light ray at the second wavelength [for example, 445 (nm)] lower than the cut-off wavelength to pass through and reflects the light ray at the first wavelength [for example, 635 (nm)] higher than the cut-off wavelength. The first wavelength is higher than the cut-off wavelength, and the second wavelength is lower than the cut-off wavelength.

The second face 122 of the second prism 120 is adjacent to the first face 111 of the first prism 110, so that a part of the first wavelength-selective film 150 is located between the first face 111 of the first prism 110 and the second face 122 of the second prism 120. The first face 131 of the third prism 130 is adjacent to the second face 112 of the first prism 110, so that a part of the second wavelength-selective film 160 is located between the second face 112 of the first prism 110 and the first face 131 of the third prism 130.

The first face 141 of the fourth prism 140 is adjacent to the second face 132 of the third prism 130, so that another part of the first wavelength-selective film 150 is located between the second face 132 of the third prism 130 and the first face 141 of the fourth prism 140. The second face 142 of the fourth prism 140 is adjacent to the first face 121 of the second prism 120, so that another part of the second wavelength-selective film 160 is located between the first face 121 of the second prism 120 and the second face 142 of the fourth prism 140.

The beam splitter 170 is disposed between the first prism 110 and the image capturing device 180, and is located at a side of a third face 113 of the first prism 110.

The light source 190 is used to emit a light ray 191, the light ray 191 enters the beam splitter 170, and the direction that the light ray 191 enters the beam splitter 170 is perpendicular to an image receiving direction of the image capturing device 180. The light source 190 may have a switching function and is capable of emitting a first wavelength light ray 192 (i.e., the light ray with first wavelength) 192 or a second wavelength light ray 193 (i.e., the light ray with second wavelength), or the light source 190 is also capable of emitting white light. In this implementation, the first wavelength light ray 192 refers to a light ray at a single wavelength [for example, 635 (nm)] higher than a cut-off wavelength 550 (nm), and the second wavelength light ray 193 refers to a light ray at a single wavelength [for example, 445 (nm)] lower than the cut-off wavelength 550 (nm). However, the first wavelength light ray or the second wavelength is not limited at the single wavelengths, and may also be a light ray at a continuous wavelength range, for example: the first wavelength light ray 192 is a light ray higher than the cut-off wavelength 550 (nm), and the range of the light wavelength is 550 (nm) to 700 (nm). The second wavelength light ray 193 is a light ray lower than 550 (nm), and the range of the light wavelength is 400 (nm) to 550 (nm). Please refer to FIG. 1b, it is assumed that when the light source 190 emits the first wavelength light ray 192, being partially reflected by the beam splitter 170, the light ray enters through the third face 113 of the first prism 110, at this time, the path of the first wavelength light ray 192 is the following two:

The first path is that: the first wavelength light ray 192 reaches the first face 111 of the first prism 110, the first wavelength light ray 192 is directly transmitted to the second prism 120 because of the first wavelength-selective film 150, and as the second wavelength-selective film 160 is formed on the second face 142 of the fourth prism 140, the first wavelength light ray 192 is reflected by the second wavelength-selective film 160 and is emitted from a third face 123 of the second prism 120.

The second path is: the first wavelength light ray 192 reaches the second face 112 of the first prism 110, and the first wavelength light ray 192 is reflected and passes through the first face 111 of the first prism 110, the second face 122 of the second prism 120, and the third face 123 of the second prism 120 sequentially because of the second wavelength-selective film 160.

If the first wavelength light ray 192 leaves the third face 123 of the second prism 120 and reaches an upper substrate 910 and is reflected, the reflected light ray moves reversely along the aforementioned first or second path, and is partially transmitted through the beam splitter 170, so as to form an image on the image capturing device 180, so that the image capturing device 180 can photograph the pattern on the upper substrate 910.

Figure 1C:
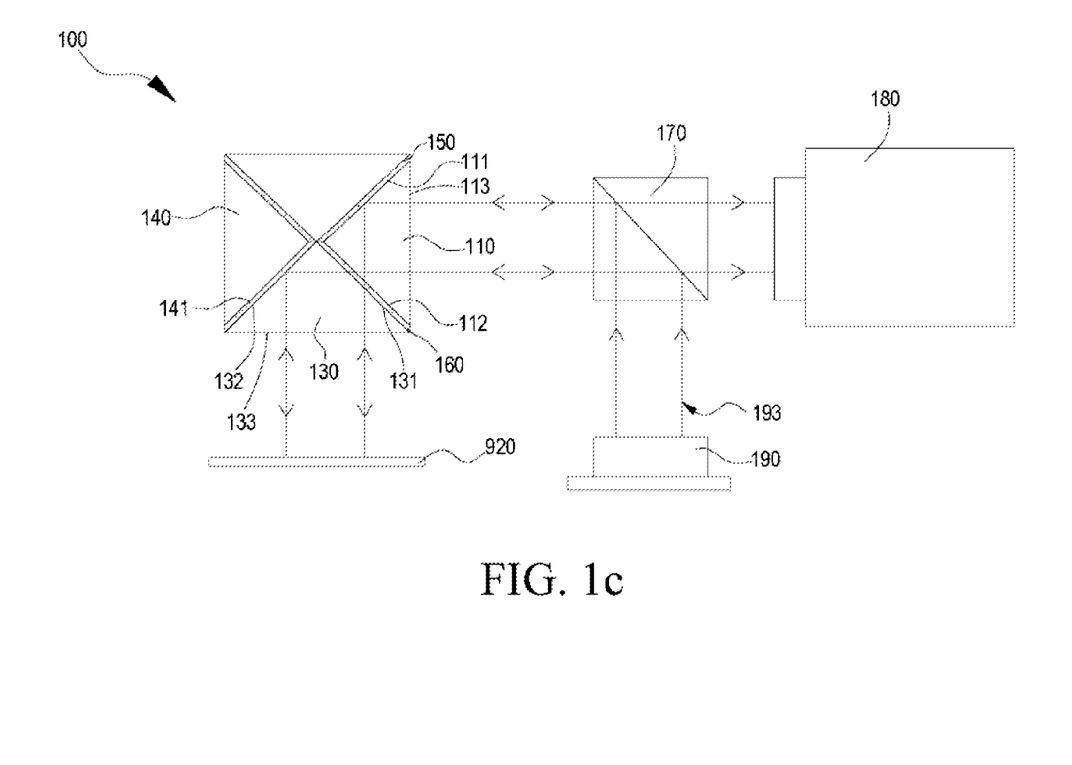
FIG. 1c is a schematic structural view of an optical image capturing module according to an embodiment of the present invention showing a light path of a second wavelength light ray at the wavelengths lower than the cut-off wavelength.
Figure 1D:
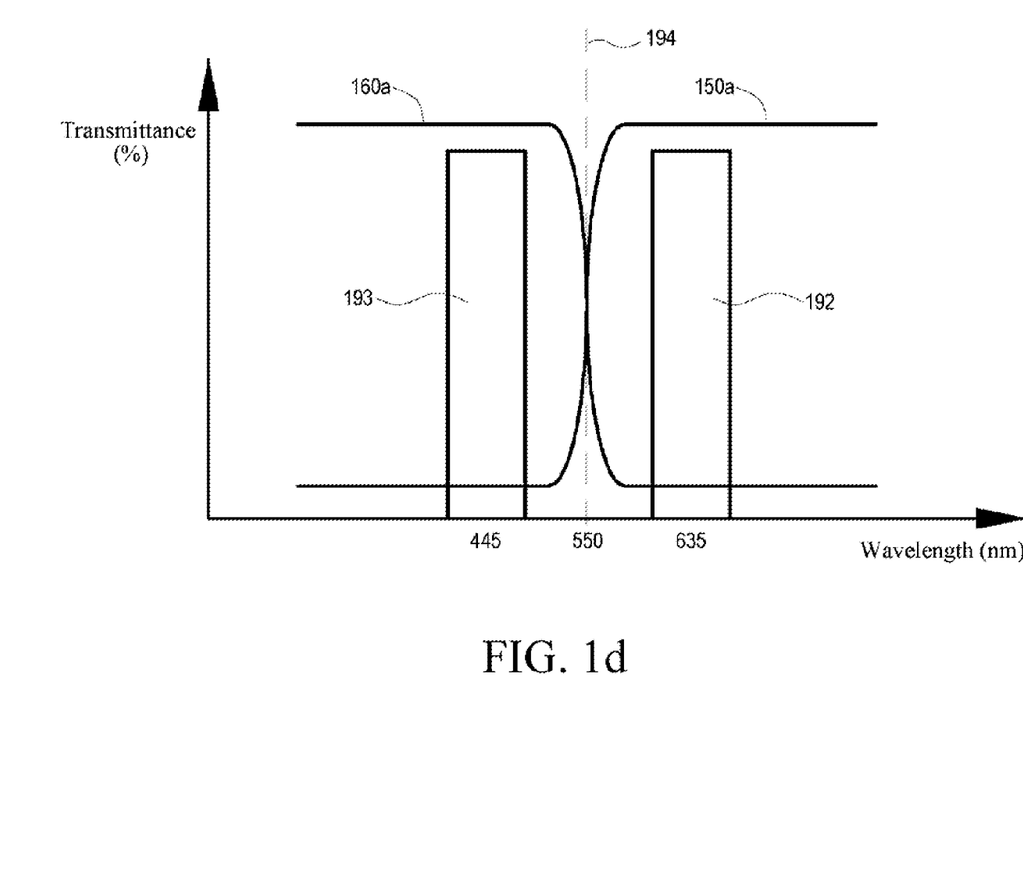
FIG. 1d is a spectral diagram for showing different light wavelengths of a first wavelength-selective film and a second wavelength-selective film.

Please refer to FIG. 1c. It is assumed that when the light source 190 emits the second wavelength light ray 193, being reflected by the beam splitter 170, the second wavelength light ray 193 enters from the third face 113 of the first prism 110, and at this time, the path of the second wavelength light ray 193 is the following two:

The first path is that: the second wavelength light ray 193 reaches the first face 111 of the first prism 110, because of the first wavelength-selective film 150, the second wavelength light ray 193 is reflected and passes through the second face 112 of the first prism 110, the first face 131 of the third prism 130, and a third face 133 of the third prism 130.

The second path is that: the second wavelength light ray 193 reaches the second face 112 of the first prism 110, the second wavelength light ray 193 is directly transmitted to the third prism 130 because of the second wavelength-selective film 160, and as the first wavelength-selective film 150 is formed on the first face 141 of the fourth prism 140, the second wavelength light ray 193 is reflected by the first wavelength-selective film 150 and emits from the third face 133 of the third prism 130.

If the light ray leaves the third face 133 of the third prism 130 and reaches a lower substrate 920 and is reflected, the reflected light ray moves reversely along the aforementioned first or second path, and is partially transmitted through the beam splitter 170, so as to form an image on the image capturing device 180, so that the image capturing device 180 can photograph the pattern on the lower substrate 920.

If the light source 190 emits white light, the white light is divided into the first wavelength light ray 192 and the second wavelength light ray 193 because of the design of the first wavelength-selective film 150 and the second wavelength-selective film 160. The first wavelength light ray 192 moves along the path of the first wavelength light ray 192 shown in FIG. 1b, and the second wavelength light ray 193 moves along the path of the second wavelength light ray 193 shown in FIG. 1c, and light rays reaching the upper substrate and the lower substrate form images on the image capturing device 180 at the same time, so that the image capturing device 180 can observe the patterns on the upper substrate and the lower substrate at the same time.

Figure 2:
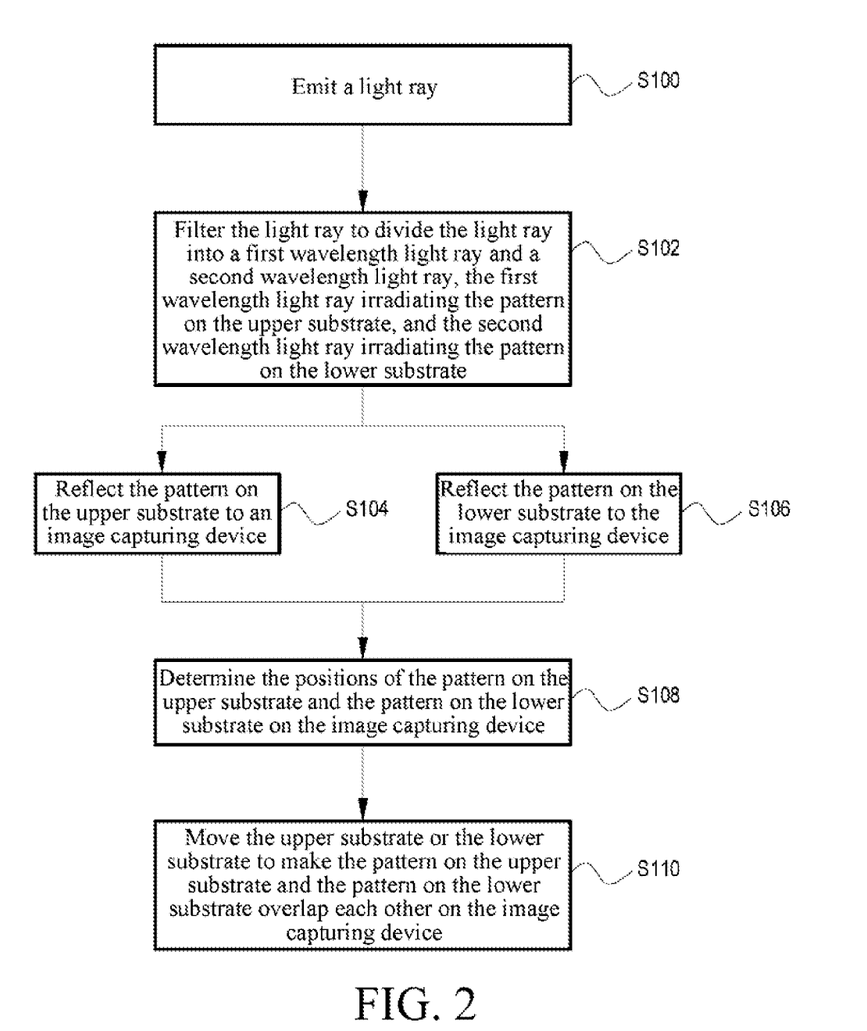
FIG. 2 is a flow chart of an alignment method according to an embodiment of the present invention.
Figure 3A:
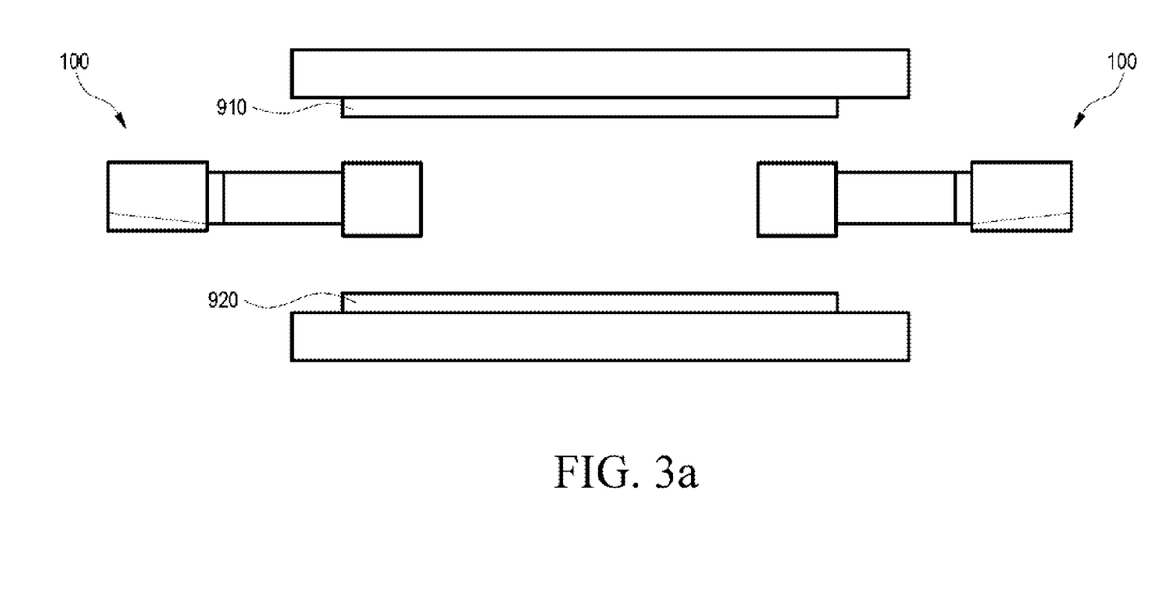
FIG. 3a is a schematic sectional view of an upper substrate, a lower substrate, and an optical image capturing module.
Figure 3B:
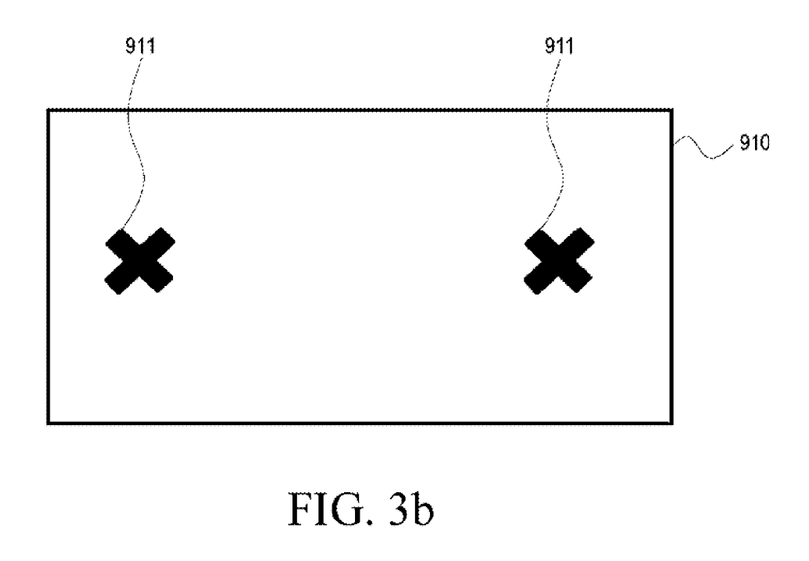
FIG. 3b is a plane view of an upper substrate.
Figure 3C:
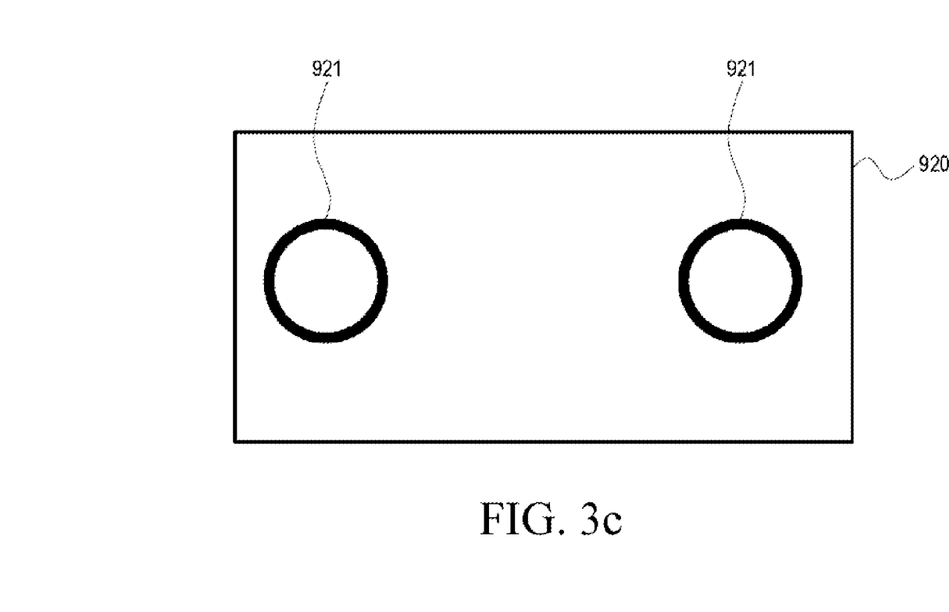
FIG. 3c is a plane view of a lower substrate.
Figure 3D:
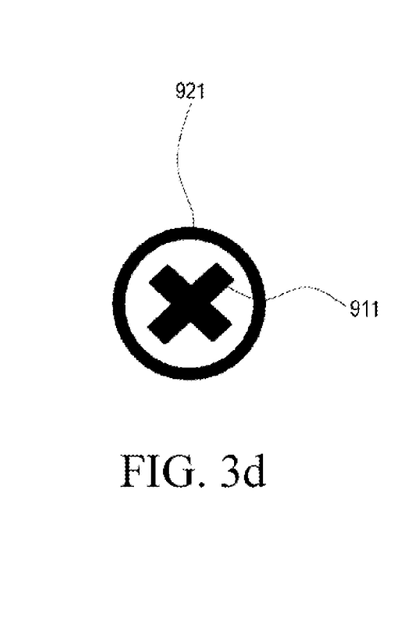
FIG. 3d is a schematic view showing the pattern on an upper substrate overlaps the pattern on a lower substrate.

FIG. 2 is a flow chart of an alignment method according to an embodiment of the present invention. The alignment method is mainly used for aligning an upper substrate and a lower substrate. FIG. 3a is a schematic sectional view of an upper substrate, a lower substrate, and an optical image capturing module and shows the relative positions. The upper substrate 910 and the lower substrate 920 are disposed opposite, and two groups of optical image capturing modules 100 are disposed between the upper substrate 910 and the lower substrate 920. The alignment method mainly adopts the optical image capturing module 100 in the embodiment of the present invention, and the optical image capturing module 100 is disposed between the upper substrate 910 and the lower substrate 920. FIG. 3b is a plane view of an upper substrate and shows an X-shaped pattern 911 on the surface of the upper substrate 910. FIG. 3c is a plane view of a lower substrate and shows an O-shaped pattern 921 on the surface of the lower substrate 920. Please refer to FIG. 1a to FIG. 1c, FIG. 2, and FIG. 3a to FIG. 3d at the same time.

Step S100: Emit a light ray. In this step, a light source 190 emits a light ray, and the light ray is white light or a light ray having a first wavelength light ray 192 and a second wavelength light ray 193 at the same time.

Step S102: Filter the light ray to divide the light ray into a first wavelength light ray and a second wavelength light ray, the first wavelength light ray irradiating the pattern on the upper substrate, and the second wavelength light ray irradiating the pattern on the lower substrate. In this step, the paths of the first and second wavelength light ray 192, 193 are shown in FIG. 1b and FIG. 1c. Therefore, the first wavelength light ray 192 irradiates the X-shaped pattern 911 on the upper substrate 910 (shown in FIG. 3b), and the second wavelength light ray 193 irradiates the O-shaped pattern 921 on the lower substrate 920 (shown in FIG. 3c).

Step S104: Reflect the pattern on the upper substrate to an image capturing device. In this step, the first wavelength light ray 192 irradiates the X-shaped pattern 911 on the upper substrate 910 and is reflected, and the reflected first wavelength light ray 192 irradiates the image capturing device 180 along the original light path. Therefore, the X-shaped pattern 911 on the upper substrate 910 forms an image on the image capturing device 180.

Step S106: Reflect the pattern on the lower substrate to the image capturing device. In this step, the second wavelength light ray 193 irradiates the O-shaped pattern 921 on the lower substrate 920 and is reflected, and the reflected second wavelength light ray 193 irradiates the image capturing device 180 along the original light path. Therefore, the O-shaped pattern 921 on the lower substrate 920 forms an image on the image capturing device 180.

Step S104 and Step S106 take place at the same time. Therefore, the X-shaped pattern 911 on the upper substrate 910 and the O-shaped pattern 921 on the lower substrate 920 form images on the image capturing device 180.

Step S108: Determine the positions of the pattern on the upper substrate and the pattern on the lower substrate on the image capturing device. In this step, as the X-shaped pattern 911 on the upper substrate 910 and the O-shaped pattern 921 on the lower substrate 920 form images on the image capturing device 180 at the same time, the positions of the pattern on the upper substrate 910 and the pattern on the lower substrate 920 on the image capturing device 180 can be learned in an image determination manner.

Step S110: Move the upper substrate or the lower substrate to make the pattern on the upper substrate and the pattern on the lower substrate overlap each other on the image capturing device. In this step, the upper substrate 910 or the lower substrate 920 is moved horizontally, and when the X-shaped pattern 911 on the upper substrate 910 and the O-shaped pattern 921 on the lower substrate 920 overlap each other on the image capturing device 180 (shown in FIG. 3d), it can be determined that the alignment action has been accomplished for the upper substrate 910 and the lower substrate 920.

Figure 4:
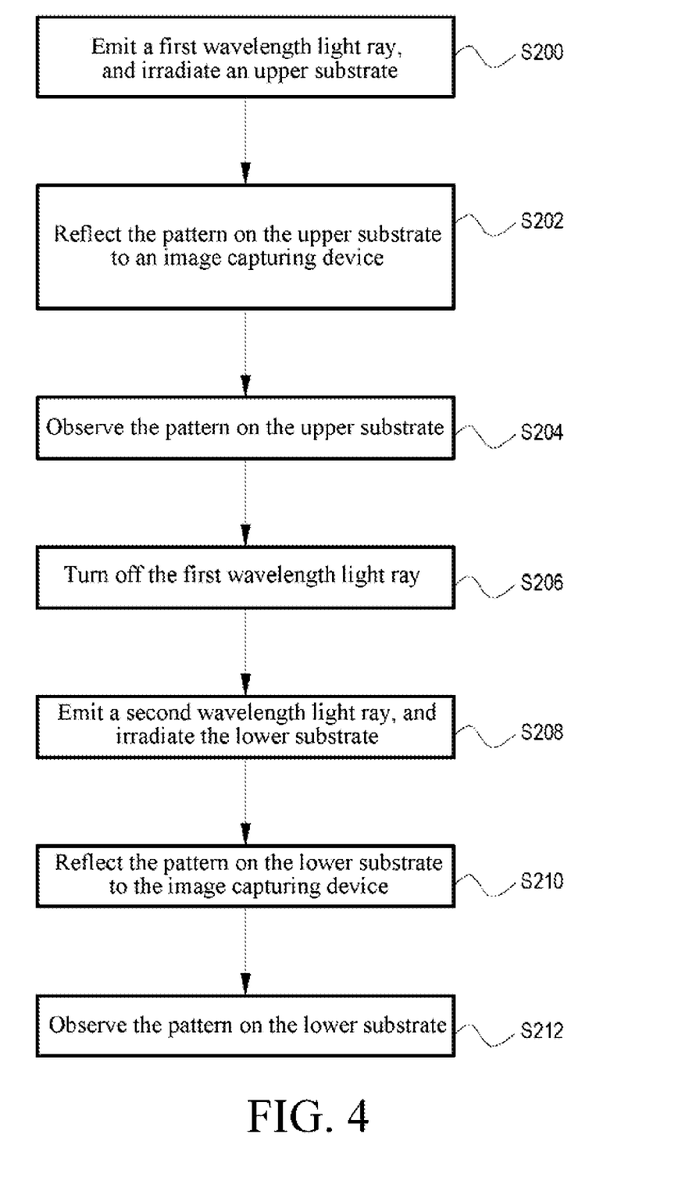
FIG. 4 is a flow chart of an observation method according to an embodiment of the present invention.

FIG. 4 is a flow chart of an observation method according to an embodiment of the present invention. The observation method can be used to observe the surfaces of the upper substrate 910 or the lower substrate 920. The observation method mainly adopts the optical image capturing module 100 in the embodiment of the present invention, and the optical image capturing module 100 is disposed between the upper substrate 910 and the lower substrate 920 (shown in FIG. 3a). Please refer to FIG. 1a to FIG. 1c, FIG. 3a to FIG. 3c, and FIG. 4 at the same time.

Step S200: Emit a first wavelength light ray, and irradiate an upper substrate. In this step, a light source 190 emits a light ray at first wavelength 192. The path of the first emitted light ray 192 is shown in FIG. 1b. Therefore, the first emitted light ray 192 irradiates the X-shaped pattern 911 on the upper substrate 910 (shown in FIG. 3b).

Step S202: Reflect the pattern on the upper substrate to an image capturing device. In this step, the first emitted light ray 192 irradiates the X-shaped pattern 911 on the upper substrate 910 and is reflected, and the reflected first emitted light ray 192 irradiates the image capturing device 180 along the original light path. Therefore, the X-shaped pattern 911 on the upper substrate 910 forms an image on the image capturing device 180.

Step S204: Observe the pattern on the upper substrate. In this step, the image capturing device 180 observes the X-shaped pattern 911 on the upper substrate 910.

Step S206: Turn off the first emitted light ray. In this step, the light source 190 is controlled to stop the light source 190 from emitting the first emitted light ray 192.

Step S208: Emit a second wavelength light ray, and irradiate a lower substrate. In this step, the light source 190 emits a second wavelength light ray 193, the path of the second wavelength light ray 193 shown in FIG. 1c, and the second wavelength light ray 193 irradiates the O-shaped pattern 921 on the lower substrate 920 (shown in FIG. 3c).

Step S210: Reflect the pattern on the lower substrate to the image capturing device. In this step, the second wavelength light ray 193 irradiates the O-shaped pattern 921 on the lower substrate 920 and is reflected, and the reflected second wavelength light ray 193 irradiates the image capturing device 180 along the original light path. Therefore, the O-shaped pattern 921 on the lower substrate 920 forms an image on the image capturing device 180.

Step S212: Observe the pattern on the lower substrate. In this step, the image capturing device 180 observes the O-shaped pattern 921 on the lower substrate 920.

In conclusion, the present invention has the following characteristics:

1. The present invention can provide symmetrical light path lengths, helpfully reduce the volume of an image module component, and can achieve symmetrically working distances, and symmetry is achieved for the images at the two sides. Compared with that a compound right-angle prism causes unequal reflection paths for the light rays from the upper object and the lower object in the prior art, considering in terms of image capturing, the present invention does not cause unequal working distances, and therefore the upper object and the lower object (an upper substrate and a lower substrate) in the present invention are not required to be placed at asymmetrical distances.

2. The present invention can provide an imaging method capable of irradiating objects to test by adopting light paths of coaxial light sources. Compared with an imaging method that a compound right-angle prism only can only irradiate objects to test by using external light sources in the prior art, the flexibility and applications for spatial use are further enhanced.

3. The present invention can provide a mechanism of rapidly switching light paths, physical shutter components are not required, and compared with a conventional mechanical or electronic liquid crystal shutter, the time is shorter and the control manner is simpler.

4. The present invention can effectively increase alignment precision for the alignment of an upper substrate and a lower substrate and reduce errors resulting from optical and mechanical component assembly.

5. The present invention is applicable to industries requiring precise alignment and positioning, such as touch panel and IC electronic bonding, provides a high-stability image display manner, reduces errors and labeling problems in mechanical movement control, and enhances the fabrication process technologies, production speed, and product yield in the industries.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An optical image capturing module, comprising:
    an image capturing device;
    a first prism, having a first face, a second face, and a third face, wherein the first face and the second face of the first prism have an equal sectional length;
    a second prism, having a first face and a second face, wherein the first face and the second face of the second prism have an equal sectional length, and the second face of the second prism is adjacent to the first face of the first prism;
    a third prism, having a first face and a second face, wherein the first face and the second face of the third prism have an equal sectional length, and the first face of the third prism is adjacent to the second face of the first prism;
    a fourth prism, having a first face and a second face, wherein the first face and the second face of the fourth prism have an equal sectional length, the first face of the third prism is adjacent to the second face of the third prism, and the second face of the fourth prism is adjacent to the first face of the second prism;
    a beam splitter, disposed between the first prism and the image capturing device, and located at a side of the third face of the first prism;
    a light source, used to emit a light ray, wherein the light ray enters the beam splitter, and a direction that the light ray enters the beam splitter is perpendicular to an image receiving direction of the image capturing device;
    a first wavelength-selective film, wherein a part of the first wavelength-selective film is located between the first face of the first prism and the second face of the second prism, and another part of the first wavelength-selective film is located between the second face of the third prism and the first face of the fourth prism, the first wavelength-selective film allows a first wavelength light ray higher than a cut-off wavelength to pass through and reflects a second wavelength light ray lower than the cut-off wavelength; and
    a second wavelength-selective film, wherein a part of the second wavelength-selective film is located between the second face of the first prism and the first face of the third prism, and another part of the second wavelength-selective film is located between the first face of the second prism and the second face of the fourth prism, the second wavelength-selective film allows the second wavelength light ray lower than the cut-off wavelength to pass through and reflects the first wavelength light ray higher than the cut-off wavelength;
    wherein the cut-off wavelength is the intersection between a transmittance curve of the first wavelength-selective film and a transmittance curve of the second wavelength-selective film;
    wherein the light source is adapted to emit the first wavelength light ray and the second wavelength light ray;
    wherein the first wavelength light ray is adapted to irradiate a first pattern on an upper substrate, and reflect the first pattern on the upper substrate to the image capturing device;
    wherein the second wavelength light ray is adapted to irradiate a second pattern on the lower substrate, and reflect the second pattern on a lower substrate to the image capturing device;
    wherein the first pattern and the second pattern are selectively projected either simultaneously or separately onto the upper substrate and lower substrate, respectively, and the first pattern and the second pattern comprise distinct shapes;
    whereby a distance of a reflection path for the first wavelength light ray from the light source to the upper substrate and then from the upper substrate to the image capturing device is equal to a distance of a reflection path for the second wavelength light ray from the light source to the lower substrate and then from the lower substrate to the image capturing device; and
    wherein the image capturing module provides symmetrical light path lengths, and is not required to be placed at an asymmetrical distance between the upper and lower substrate for adjustment.

2. The optical image capturing module according to claim 1, wherein the light source emits white light.

3. The optical image capturing module according to claim 1, wherein the first wavelength light ray is a light ray at a single wavelength higher than the cut-off wavelength, and the second wavelength light ray is a light ray at a single wavelength lower than the cut-off wavelength.

4. The optical image capturing module according to claim 1, wherein the first wavelength light ray is a light ray at the wavelengths higher than the cut-off wavelength, and the second wavelength light ray is a light ray at the wavelengths lower than the cut-off wavelength, and the first wavelength light ray and the second wavelength light ray are light rays in a continuous wavelength range.

5. An alignment method for an upper substrate and a lower substrate, the upper substrate and the lower substrate being disposed opposite, and the alignment method comprising the following steps of:
    providing an optical image capturing module as claimed in claim 1, wherein the optical image capturing module is disposed between the upper substrate and the lower substrate;
    emitting a light ray;
    filtering the light ray to divide the light ray into a first wavelength light ray and a second wavelength light ray, whereby the first wavelength light ray irradiates a pattern on the upper substrate, and the second wavelength light ray irradiates a pattern on the lower substrate;
    reflecting the pattern on the upper substrate to an image capturing device;
    reflecting the pattern on the lower substrate to the image capturing device; and determining the positions of the pattern on the upper substrate and the pattern on the lower substrate on the image capturing device; and moving the upper substrate or the lower substrate to make the pattern on the upper substrate and the pattern on the lower substrate overlap each other on the image capturing device.

6. An observation method, used to observe a pattern on an upper substrate or a lower substrate, the upper substrate and the lower substrate being disposed opposite, and the observation method comprising the following steps of:

providing an optical image capturing module as claimed in claim 1, wherein the optical image capturing module is disposed between the upper substrate and the lower substrate;

emitting a first wavelength light ray, and irradiating the upper substrate;

reflecting the pattern on the upper substrate to an image capturing device;

observing the pattern on the upper substrate;

turning off the first wavelength light ray;

emitting a second wavelength light ray, and irradiating the lower substrate;

reflecting the pattern on the lower substrate to the image capturing device; and observing the pattern on the lower substrate.

7. The observation method according to claim 6, wherein the first wavelength light ray has a wavelength higher than a cut-off wavelength, and the second wavelength light ray has a wavelength lower than the cut-off wavelength.

* * * * *